United States Patent [19]

Kikuchi et al.

[11] Patent Number: 4,693,782
[45] Date of Patent: Sep. 15, 1987

[54] FABRICATION METHOD OF SEMICONDUCTOR DEVICE

[75] Inventors: Kazuya Kikuchi, Hirakata; Tadao Komeda, Ikoma; Tsutomu Fujita, Hirakata, all of Japan

[73] Assignee: Matsushita Electric Industrial Co., Ltd., Kadoma, Japan

[21] Appl. No.: 903,132

[22] Filed: Sep. 3, 1986

[30] Foreign Application Priority Data

Sep. 6, 1985 [JP] Japan ............................ 60-198075
Sep. 6, 1985 [JP] Japan ............................ 60-198082

[51] Int. Cl.⁴ .................. H01L 21/306; B44C 1/22; C03C 15/00; C03C 25/06
[52] U.S. Cl. ............................ 156/653; 156/657; 156/661.1; 156/662; 357/34; 357/43; 437/235; 437/241

[58] Field of Search ............. 148/1.5, 187, 190; 29/571, 576 W, 576 B, 580, 578; 427/88, 93, 94; 156/643, 652, 653, 655, 657, 659.1, 661.1, 662; 357/23.1, 23.11, 34, 43, 59, 91

[56] References Cited

U.S. PATENT DOCUMENTS 4,157,269  6/1979  Ning et al. ................. 156/653 X
4,484,388  11/1984  Iwasaki ..................... 156/662 X
4,486,942  12/1984  Hirao ........................ 29/571

Primary Examiner—William A. Powell
Attorney, Agent, or Firm—Wenderoth, Lind & Ponack

[57] ABSTRACT

A method of fabrication of a semiconductor device by forming a thin film pattern in the emitter region, forming a base lead-out electrode self-aligningly by using this thin film pattern, and also forming a fine graft base region and emitter region, and an oxide film for isolating the emitter region and base region, whereby the emitter diffusion layer and active base diffusion layer are formed in a shallow depth of diffusion by heat diffusion from the semiconductor film in which ions are implanted.

30 Claims, 24 Drawing Figures

FABRICATION METHOD OF SEMICONDUCTOR DEVICE

This invention relates to a fabrication method of a semiconductor device with characteristics of high speed and low power consumption.

BACKGROUND OF THE INVENTION

To realize high speed and low power consumption in a bipolar transistor, it is necessary to reduce pattern size and lower junction capacitance. Conventionally it was attempted to reduce the pattern size and lower the junction capacitance by forming base lead-out electrodes by polycrystal silicon film (polysilicon film). For example, in the IEEE Journal of Solid-State Circuits, Vol. SC-16, No. 5, October 1981, page 424 et seq., "A 3-ns 1-kbit RAM Using Super Self-Aligned Process Technology" Tetsushi TAKAI et al., the process of forming the base lead-out electrodes by boron doped polysilicon film is disclosed.

In the IEEE Journal, the integrated transistor structure using super self-aligned process technology is explained as follows.

"The spacing between n+ polysilicon emitter and p+ polysilicon base electrode is less than 1 μm. These electrodes are separated during the self-aligned fabrication process using one photomask at the emitter pattern edge, together with the formation of the emitter area.

A significant reduction in the external base region is achieved by this technology, which leads to lower base resistance and parasitic capacitances.

The n+ polysilicon and p+ polysilicon are used for the diffusion source, as well as for the electrodes. These doped polysilicon electrodes make it possible to form a stable shallow junction, resulting in a high cutoff frequency.

There are the p+ and p++ base regions around the emitter region. This p+ base region, formed by the self-aligned fabrication processes, stabilizes transistor performance, especially, the current gain $h_{FE}$ in the lower collector current region.

The $SiO_2$ film thickness on the p+ polysilicon, the n+ polysilicon and the p+ base region is about 0.25–0.3 μm. The side wall of the emitter region is $SiO_2$ and the emitter-base junction is flat, therefore, the emitter-base junction capacitance is smaller than that of conventional transistors."

Further, in the IEEE Journal, the fabrication steps are explained as follows.

"The fabrication steps are same as the conventional bipolar IC process until a base diffused layer is formed.

The subsequent steps are as follows.

(1) After the base implantation process, undoped polysilicon is deposited. The unnecessary portions of polysilicon are oxidized.

(2) $Si_3N_4$ and $SiO_2$ films are deposited. The $SiO_2$ except for the emitter and collector contact is etched away.

(3) Boron is implanted into the undoped polysilicon. The $SiO_2$ fabricated in process stage (2) serves as a mask when boron is implanted.

(4) $Si_3N_4$ is etched with slight side-etching. The undoped polysilicon is etched away with submicrometer width by using the selective etch rate of the boron-implanted polysilicon, which is about 3 percent or less than that of the undoped polysilicon.

(5) The silicon is oxidized. The $Si_3N_4$ is etched away. Then the p+ base region is formed by boron implantation without a mask. Therefore, the p+ *base region is formed by the self-aligned fabrication processes.*

(6) n-type impurity is doped into the undoped polysilicon, and then an emitter region is formed by diffusion.

(7) Conventional processes are used for the rest of the fabrication steps."

However, the fabrication process disclosed in this IEEE Journal of Solid-State Circuits has the following problems.

(1) It is difficult to form the polysilicon film used as emitter electrode at high precision and finely.

That is, the polysilicon film used as emitter electrode is formed by etching the undoped polysilicon film which is faster in etching rate, using $SiO_2$ film as mask, by making use of the difference in etching rate between the boron doped polysilicon film having boron ions doped, and undoped polysilicon film. However, when forming a boron doped polysilicon film, the area under the $SiO_2$ film region also becomes a boron doped polysilicon film. Accordingly, in order that the undoped polysilicon film may be etched, it is necessary to side-etch an $Si_3N_4$ film. Besides, in order to isolate the undoped polysilicon film and boron doped polysilicon film completely, it is required to etch for the portion of film thickness of undoped polysilicon film. As a result, at least a side etching corresponding to the portion of film thickness of undoped polysilicon film is left over. Therefore, the amount of side etching of undoped polysilicon film varies due to the effects of penetration of boron doped polysilicon film into the area under the $SiO_2$ film region, side etching amount of $Si_3N_4$ film, uneven film thickness of undoped polysilicon film, and fluctuations of etching time of undoped polysilicon film, etc. Accordingly, the pattern dimension of the undoped polysilicon film serving as emitter electrode varies, and it is hard to form finely at high precision.

(2) It is difficult to reduce the resistance of boron doped polysilicon film used as base lead-out electrode.

That is, the boron doped polysilicon film loses its Si by about half the thickness of $SiO_2$ film due to its forming, and becomes thin and is consequently raised in the resistance.

Accordingly, if the film thickness is increased in order to lower the resistance of boron doped polysilicon film, as mentioned above, the side etch amount of the undoped polysilicon film in the area under $SiO_2$ film region increases, and the precision of the pattern dimension of the undoped polysilicon film used as emitter electrode is lowered. At the same time, the spacing between the undoped polysilicon film and boron doped polysilicon film is widened, and the resistance of p+ diffusion layer increases and the junction capacitance also increases. In order to control the loss of boron doped polysilicon film due to oxidation, if the thickness of $SiO_2$ film is reduced, the insulation of the $SiO_2$ film may not be satisfied.

(3) Stress is likely to occur when forming $SiO_2$ film.

That is, when $SiO_2$ film is formed is after isolating the undoped polysilicon film and boron doped polysilicon film, the space between the undoped polysilicon film and boron doped polysilicon film is concave, and stress due to oxidation is concentrated in this concave area. In this case, the stress is larger when the spacing is narrower. Therefore, when the spacing is narrowed, defects due to stress are likely to occur, which may cause reduction of yield.

(4) It is difficult to form thinly the p+ diffusion layer serving as active base diffusion layer.

That is, since boron ions are directly implanted into the n-epitaxial layer, it is susceptible to channeling effect. Accordingly, implantation energy and implantation dope in ion implantation are limited, and impurity concentrations are high, and it is hard to form an active base diffusion layer shallow in the depth of diffusion.

SUMMARY OF THE INVENTION

It is hence a primary object of this invention, in the light of the above-discussed problems, to provide a fabrication method of a semiconductor device with characteristics of high speed and low power consumption, solving all these problems.

It is another object of this invention to provide a fabrication method of a semiconductor device which is capable of forming self-aligned fine emitter region and graft base region, leading-out the graft base region in semiconductor film pattern, and easily forming shallow emitter diffusion layer and active base diffusion layer, in order to form a semiconductor device with characteristics of high speed and low power consumption.

That is, it is a first feature of this invention that its fabrication method of semiconductor device comprises a step of forming a thin film pattern on a semiconductor substrate on which an antioxidation film is formed, a step of etching the antioxidation film by using said thin film pattern as mask, a step of forming a first semiconductor film on the entire surface, a step of etching the first semiconductor film on the thin film pattern, a step of etching a desired are of the thin film pattern, a step of forming an oxide film by elective oxidation, a step of etching the antioxidation film, a step of forming a second semiconductor film on the entire surface, and a step of forming the second semiconductor film pattern in a desired area, whereby the first semiconductor film used as base lead-out electrode and the second semiconductor film pattern used as emitter electrode are insulated and isolated by the oxide film.

It is a second feature of this invention that formation of emitter diffusion layer and active base diffusion layer comprises a step of implanting ions of a first impurity for forming an active base diffusion layer into a second semiconductor film after a step of forming a second semiconductor film, a step of diffusing the first impurity from within the second semiconductor film into the semiconductor substrate by heat treatment, a step of implanting ions of a second impurity for forming an emitter diffusion layer into the second semiconductor film, and a step of diffusing the second impurity from within the second semiconductor film into said semiconductor substrate by heat treatment.

According to the present invention as described herein, the following benefits, among others, are obtained.

(1) By thin film pattern, the graft base diffusion layer region, emitter region, and first semiconductor film region serving as base lead-out electrode are determined self-aligningly.

(2) By elective oxidation using the antioxidation film left over on the emitter region as mask, it is possible to form, self-sligningly, an oxide film which insulates and isolates at a fine gap between the first semiconductor film used as base lead-out electrode, and the second semiconductor film used as emitter electrode.

(3) The graft base diffusion layer and emitter diffusion layer can be self-sligningly insulated and isolated from each other at a fine gap, without having to match the masks.

(4) By the $SiO_2$ film formed on the side wall of the second semiconductor film used as emitter electrode, invasion of metal wiring into, for example, Al interface can be prevented.

(5) By using the film pattern as field insulation film, a flat surface is obtained.

(6) By implanting ions of a desired impurity into the second semiconductor film and diffusing the impurity by heat treatment, emitter diffusion layer and active base diffusion layer with shallow depth of diffusion are formed.

Thus, in this invention, by insulation and isolation as well as by micronization, the junction capacitance is lowered, and emitter diffusion layer and active base diffusion layer with shallow depth of diffusion are formed, which greatly contributes to higher speed and lower power consumption of bipolar transistor.

While the novel features of the invention are set forth with particularly in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1A:
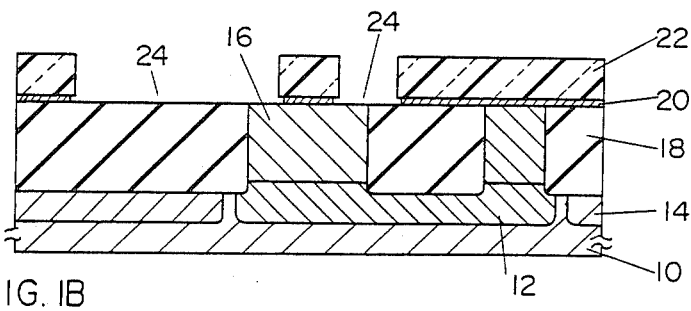
FIG. 1A to FIG. 1I are sectional views of manufacturing steps to explain the fabrication method of an NPN type bipolar transistor as a first embodiment of this invention.

FIG. 1A to FIG. 1I show manufacturing steps of an NPN type bipolar transistor according to a first embodiment of this invention. In the first place, as shown in FIG. 1A, N+ diffusion layer 12, P+ diffusion layer 14, N-epitaxial layer 16, and $SiO_2$ film 18 are formed on a P type Si substrate 10. On thus composed P type Si substrate 10, $Si_3N_4$ film 20 is formed as an antioxidation film, and then $CVD-SiO_2$ film pattern 22 is electively formed as thin film pattern. Later, using this thin film pattern 22 as mask, the $Si_3N_4$ film 22 is etched and partly removed 24.

Figure 1B:
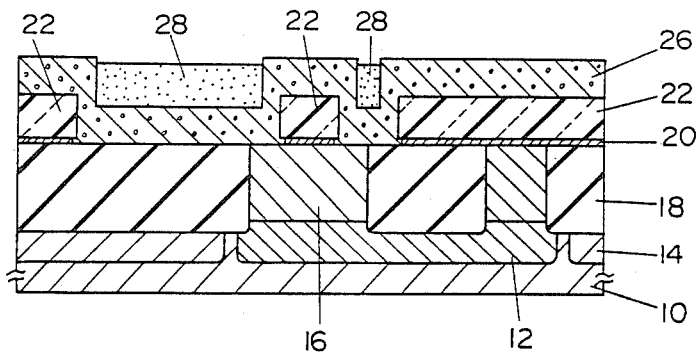
Figure 1C:
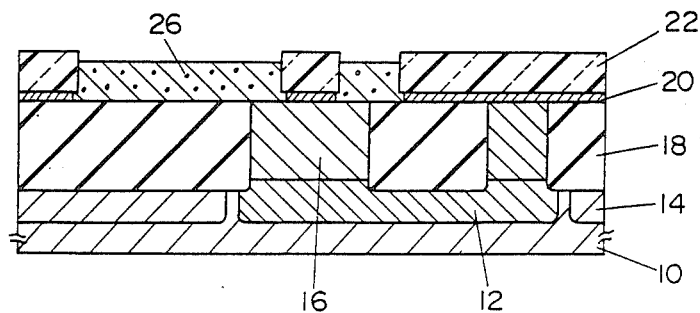
Figure 1D:
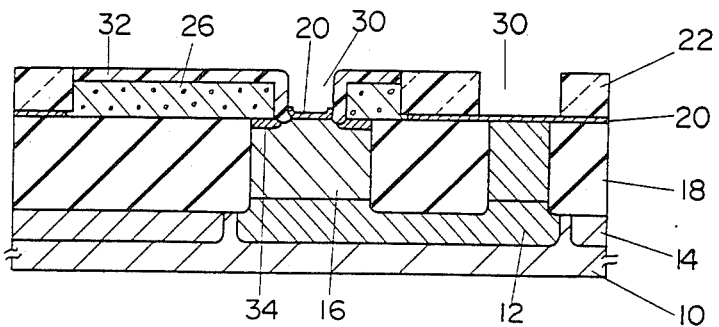

Next, as shown in FIG. 1B, a polysilicon film 26 is formed on the entire surface as a first semiconductor film. Then, in the region other than the area on the thin film pattern 22, a resist film 28 is formed as etching mask material, and using this resist film 28 as mask, the polysilicon film 26 on the thin film pattern 22 is etched and removed. The resist film 28 is removed as shown in FIG. 1C. Then, in order to form a graft base diffusion layer, boron ions are implanted into the polysilicon film 26. Later, as shown in FIG. 1D, the thin film pattern 22 of emitter region and collector region is etched and removed 30. Next, using the $Si_3N_4$ film 20 as mask, $SiO_2$ film 32 is formed by elective oxidation. At this time, the $SiO_2$ film 32 is formed not only on the polysilicon film 26 which is the first semiconductor film, but also under the $Si_3N_4$ film 20 of emitter region which film is an antioxidation film. Also, by the heat treatment by this oxidation, borons in the polysilicon film 26 diffuse into the N-epitaxial layer 16, and $P^{++}$ diffusion layer 34 is formed as a graft base diffusion layer.

Figure 1E:
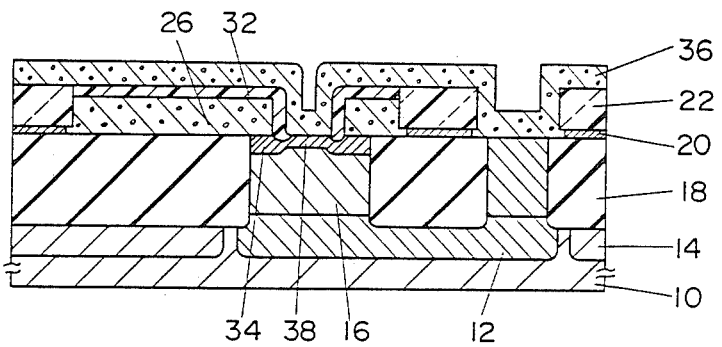

After removing the $Si_3N_4$ film 20 which is an antioxidation film in the region 30 as shown in FIG. 1E, a polysilicon film 36 is formed on the entire surface as a second semiconductor film. Afterwards, boron ions are implanted into this polysilicon film 36 in order to form an active base diffusion layer, and a $P^+$ diffusion layer 38 serving as active base diffusion layer is formed by heat treatment.

Figure 1F:
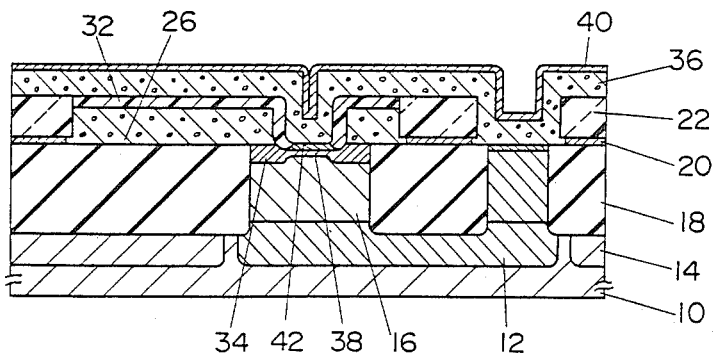

Then, in order to form an emitter diffusion layer in the polysilicon film 36 which is the second semiconductor film, arsenic ions are implanted. And, as shown in FIG. 1F, $Si_3N_4$ film is formed as antioxidation film, and $N^+$ diffusion layer 42 serving as emitter diffusion layer is formed by heat treatment.

Figure 1G:
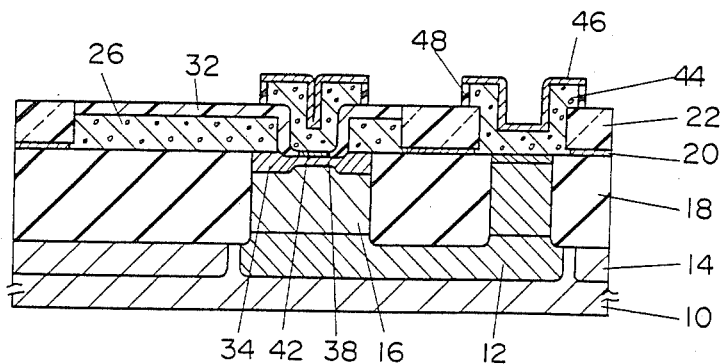

In the emitter region and collector region, as shown in FIG. 1G, a second semiconductor film pattern 44 and an $Si_3N_4$ film 46 as antioxidation film pattern are formed, and an $SiO_2$ film 48 is formed on the side wall of the second semiconductor film pattern 44 by elective oxidation.

Figure 1H:
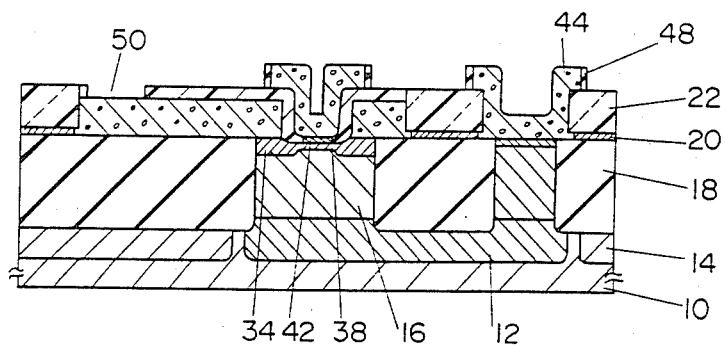

Next, as shown in FIG. 1H, the $Si_3N_4$ film 46 of antioxidation film pattern is removed, and a base contact window 50 is formed.

Figure 1I:
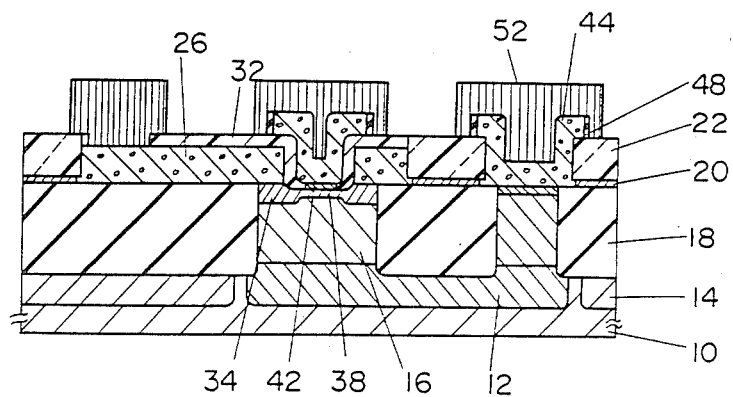

Finally, by forming an Al wiring 52 as metal wiring, an NPN type bipolar transistor is obtained as shown in FIG. 1I.

In this first embodiment of the present invention, incidentally, $CVD-SiO_2$ film is used as thin film pattern 22, but it may be replaced by light $CVD-SiO_2$ film, plasma $SiO_2$ film or other insulating thin film. Besides, instead of directly forming the $Si_3N_4$ film 20 as antioxidation film on the N-epitaxial layer 16, a thin $SiO_2$ film may be formed between them.

Moreover, when forming the graft base diffusion layer 34, borons were implanted after etching the polysilicon film 26 as the first semiconductor film on the thin film pattern 22 as shown in FIG. 1C, but, instead, ions may be implanted after forming the first semiconductor film on the entire surface, or a doped semiconductor film may be used.

In this way, according to the first embodiment, by the $CVD-SiO_2$ film pattern, the polysilicon film pattern 26 serving as graft base lead-out electrode, graft base diffusion layer 34 region, emitter diffusion layer 42 region, and emitter-base isolation $SiO_2$ film 32 may be formed self-aligningly.

Figure 2A:
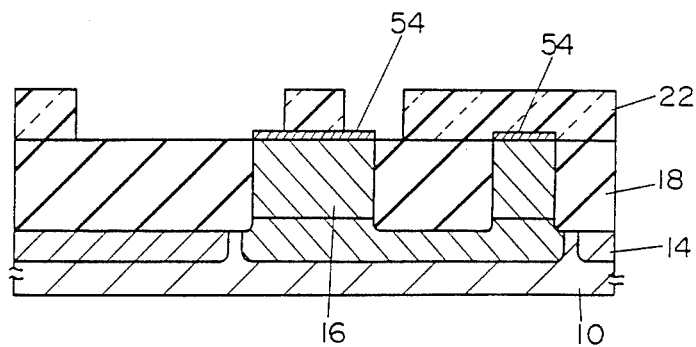
FIG. 2A and FIG. 2B are sectional views of manufacturing steps to explain the fabrication method of an NPN type bipolar transistor as a second embodiment of this invention.
Figure 2B:
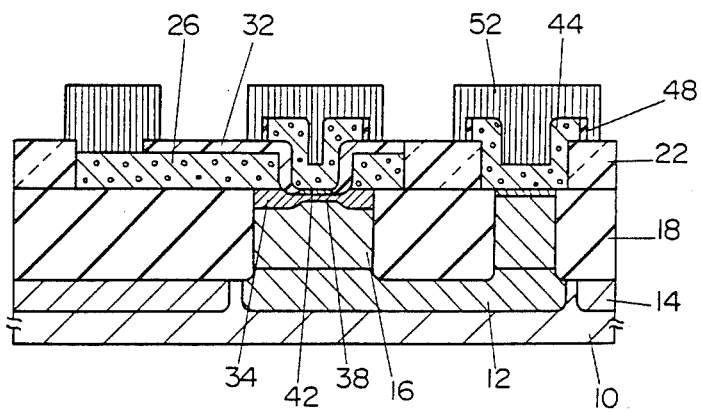

A second embodiment is shown in FIGS. 2A and 2B. This second embodiment also relates to an NPN type bipolar transistor. In the first embodiment, the $Si_3N_4$ film 29 was formed as antioxidation film on the entire surface as shown in FIG. 1A, whereas in the second embodiment, as shown in FIG. 2A, an $Si_3N_4$ film 54 is formed only in the active region as antioxidation film.

For example, the antioxidation film used as elective oxidation mask for $SiO_2$ film 18 may be directly left over and used. Then, by forming a thin film pattern 22 and processing same as in FIGS. 1A through 1H, Al wiring 52 is applied as metal wiring, so that an NPN type bipolar transistor free from residual antioxidation film may be obtained as shown in FIG. 2B.

Figure 3A:
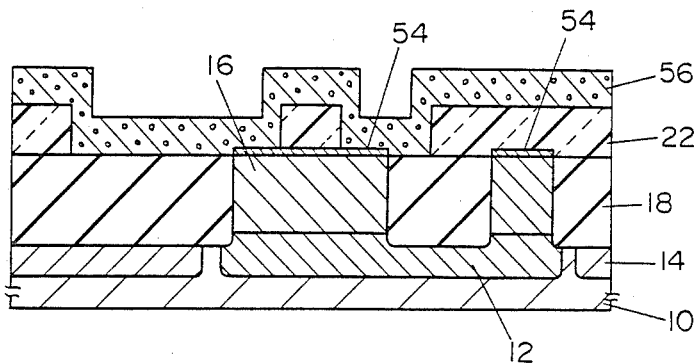
FIG. 3A to FIG. 3I are sectional views of manufacturing steps to explain the fabrication method of an NPN type bipolar transistor as a third embodiment of this invention.

FIGS. 3A through 3I illustrate manufacturing steps of an NPN type bipolar transistor according to a third embodiment of this invention. First, as shown in FIG. 3A, a $CVD-SiO_2$ film pattern 22 as a first thin film pattern is formed on an Si substrate 10 as a P type semiconductor substrate on which are formed $N^+$ diffusion layer 12, $P^+$ diffusion layer 14, N-epitaxial layer 16, $SiO_2$ film 18, and $Si_3N_4$ film 54 as antioxidation film, then a doped polysilicon film 56 is formed on the entire surface as a second thin film pattern. At this time, instead of doped polysilicon film 56, a doped polysilicon film formed by implanting ions into undoped polysilicon film, PSG film may be also used.

Figure 3B:
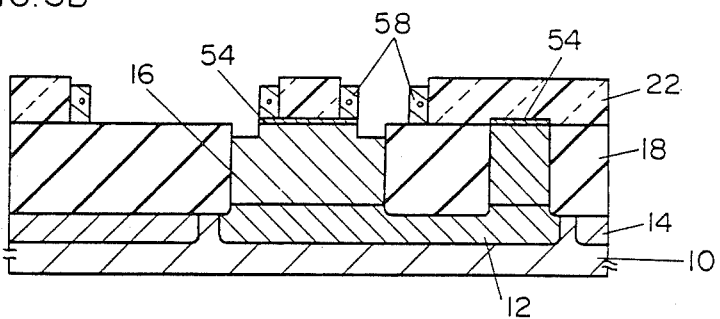

Next, as shown in FIG. 3B, the doped polysilicon film 56 is removed by anisotropic dry etching, and a doped polysilicon film pattern 58 is formed on the side wall of the $CVD-SiO_2$ film pattern 22. Then the $Si_3N_4$ film 54 is etched by using $CVD-SiO_2$ film pattern 22 and doped polysilicon film pattern 58 as mask, and the N-epitaxial layer 16 is etched to a desired length.

Figure 3C:
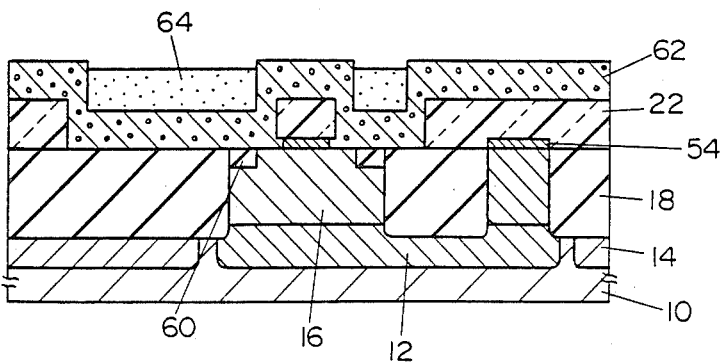

After elective etching of the doped polysilicon film pattern 58, it is electively oxidized by using the $Si_3N_4$ film 54 as mask to form an $SiO_2$ film 60 as shown in FIG. 3C. In FIG. 3C, then, the $Si_3N_4$ film 54 in the region where the doped polysilicon film 58 had been formed is removed by etching. Later, a polysilicon film 62 is formed on the entire surface as a first semiconductor film. And a resist film 64 is formed in other region than the area above the $CVD-SiO_2$ film pattern 22.

Figure 3D:
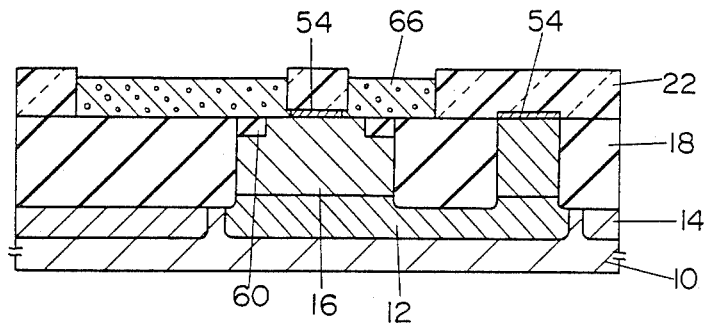

Next, using the resist film 64 as mask, the polysilicon film 62 on the $CVD-SiO_2$ film pattern 22 is etched, and polysilicon film pattern 66 is formed, and the resist film 64 is removed as shown in FIG. 3D. This polysilicon film pattern 66 becomes the lead-out electrode of graft base diffusion layer.

Figure 3E:
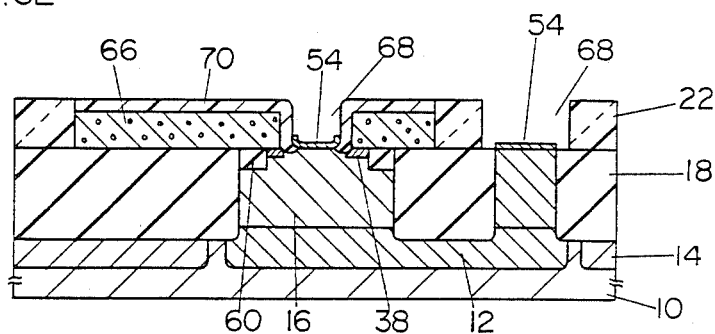

Now, in order to form a graft base diffusion layer, boron ions are implanted into the polysilicon film pattern 66. Then the $CVD-SiO_2$ film 22 of emitter region and collector region is etched and removed 68 as shown in FIG. 3E. By elective oxidation using $Si_3N_4$ film 54 as mask, an $SiO_2$ film 70 is formed. At this time, the $SiO_2$ film 70 is formed not only on the polysilicon film pattern 66, but also beneath the $Si_3N_4$ film 54. By the heat treatment of this oxidation, borons in the polysilicon film pattern 66 diffuse into the N-epitaxial layer 16, and a $P^+$ diffusion layer 34 is formed as a graft base diffusion layer.

Figure 3F:
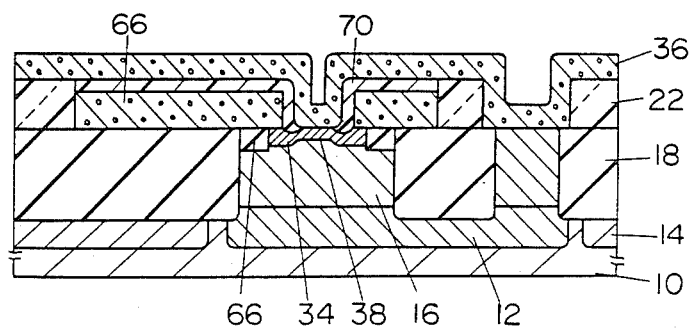

Then, after removing the $Si_3N_4$ film 54 as shown in FIG. 3F, a polysilicon film 36 is formed on the entire surface as a second semiconductor film. And, implanting ions of boron for forming an active base diffusion layer into the polysilicon film 36, $P^-$ diffusion layer 38 is formed, as an active base diffusion layer, in the N-epitaxial layer 16 by heat treatment.

Figure 3G:
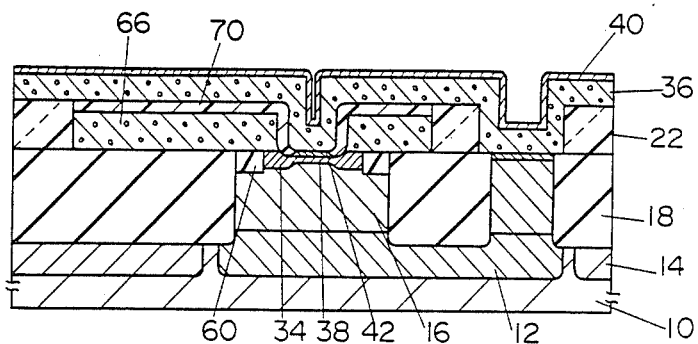

After implanting arsenic ions for forming an emitter diffusion layer into the polysilicon film 36, $Si_3N_4$ film 40 is formed as shown in FIG. 3G, and $N^+$ diffusion layer 42 is formed as emitter diffusion layer by heat treatment.

Figure 3H:
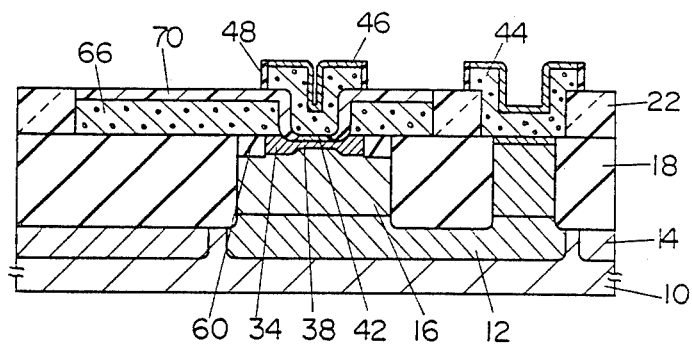

Next, polysilicon film pattern 44 and $Si_3N_4$ film pattern 46 are formed in the emitter region and collector region. And by elective oxidation, as shown in FIG. 3H, SiO$_2$ film 48 is formed on the side wall of the polysilicon film pattern 44.

Figure 3I:
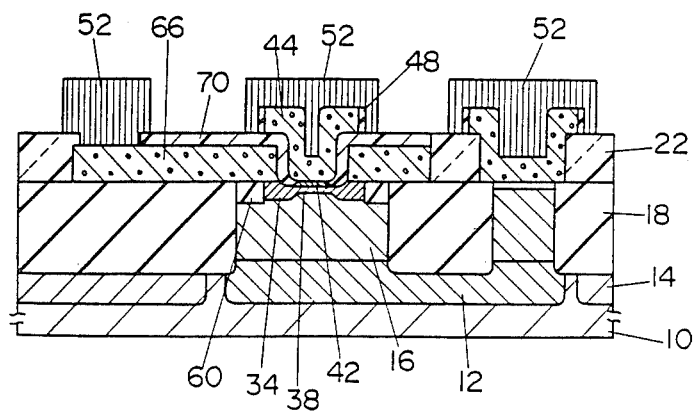

Removing the Si$_3$N$_4$ film pattern 46, a base contact window is formed in the SiO$_2$ film 70 as shown in FIG. 3I, and Al wiring 52 is applied as metal wiring, so that an NPN type bipolar transistor may be obtained.

Thus, the side wall of the P+ diffusion layer 34 is insulated and isolated by the SiO$_2$ film 60 which is deeper than this P+ diffusion layer, and the P+ diffusion layer 34 and N+ diffusion layer 42, and polysilicon film pattern 66 and polysilicon film pattern 44 are insulated and isolated by the SiO$_2$ film 70, while the SiO$_2$ film 48 is formed on the side wall of the polysilicon film pattern 44. As a result, an NPN type bipolar transistor of low junction capacitance may be obtained in a fine structure.

In this third embodiment, meanwhile, in the step shown in FIG. 3A, the Si$_3$N$_4$ film 54 was formed only in the activation region, but it may be also formed on the entire surface as stated in FIG. 1A. In such a case, in the final structure, the Si$_3$N$_4$ film is left over beneath the CVD-SiO$_2$ film pattern. Besides, as a means of separation of device, SiO$_2$ film 18 was used, but polysilicon film or the like may be buried, instead. Or, instead of directly forming the Si$_3$N$_4$ film 54 on the epitaxial layer, a thin SiO$_2$ film may be formed between them.

Moreover, in the above embodiment, it is enough if the first thin film pattern 22 and second thin film 58 are different in the etching characteristic from each other, and are also different in the etching characteristic from the antioxidation film 54 and semiconductor substrate 10. For example, as the first thin film pattern, CVD-SiO$_2$ film, plasma SiO$_2$ film, plasma Si$_3$N$_4$ film or light CVD-SiO$_2$ film may be used; or as the second thin film, any one of doped polysilicon film, doped polysilicon film having ions implanted into undoped polysilicon film, and PSG film may be used.

In formation of graft base diffusion layer 34, meanwhile, ions were implanted after etching the first semiconductor film 66 on the first thin film pattern 22, but it is also possible to implant ions after forming the first semiconductor film 66 on the entire surface, or to use a doped semiconductor film.

In this way, according to the method shown in FIG. 3, by the CVD-SiO$_2$ film pattern 22, the graft base diffusion layer 34 region, emitter diffusion layer 42 region, polysilicon film pattern 66 serving as base lead-out electrode, side wall separation SiO$_2$ film 60 of graft base diffusion layer 34, and emitter-base separation SiO$_2$ film 70 may be formed self-aligningly, and also finely.

Below is explained in further details the method of forming the emitter diffusion layer and active base diffusion layer in the above first, second and third embodiments. FIG. 4 shows the distribution of impurity concentration when forming the emitter diffusion layer and active base diffusion layer in the first embodiment shown in FIG. 1.

Figure 4A:
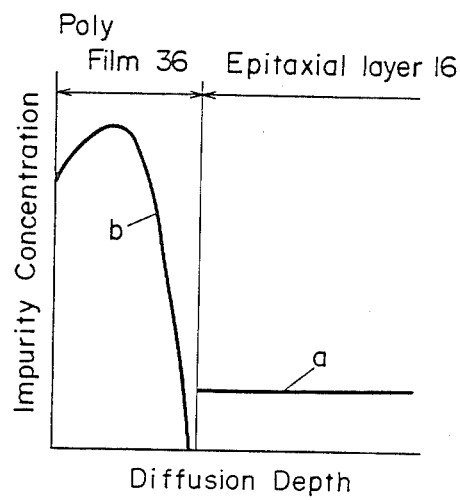
FIG. 4A to FIG. 4D are impurity concentration profiles in the sectional direction in each manufacturing step to explain the method of forming emitter diffusion layer and active base diffusion layer of the NPN type bipolar transistor fabricated in the method of the first embodiment of this invention.

As shown in FIG. 1E, when the polysilicon film 36 is formed on the entire surface and boron ions are implanted into the polysilicon film 36 to form an active base diffusion layer, the boron concentration becomes as shown in curve b in FIG. 4A. At this time, since boron ions are implanted into the polysilicon film 36, the channeling effect is restricted, and boron ions are present in the polysilicon film 36.

Figure 4B:
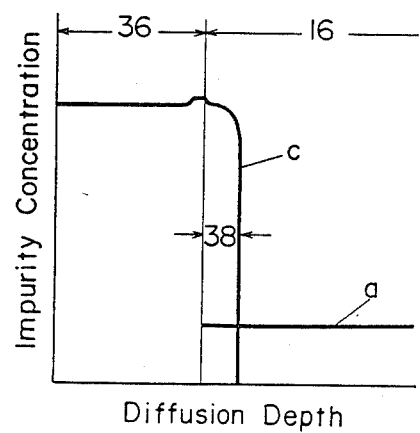

When heat treatment is applied, since the diffusion speed of boron in the polysilicon film 36 is fast, the boron concentration in the polysilicon film 36 is stabilized in a short time. This polysilicon film 36 having a constant concentration of boron becomes the diffusion source, and boron is diffused in the N-epitaxial layer 16, and the P+ diffusion layer 38 is formed in a shallow depth of diffusion as the active base diffusion layer as shown in FIG. 4B. At this time, the boron concentration curve c shows a sharp tail.

Figure 4C:
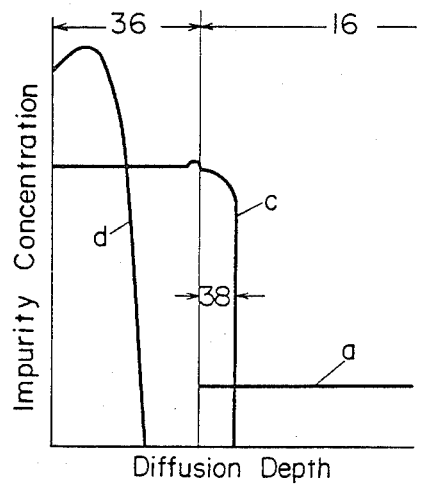

Then, in order to form an emitter diffusion layer, arsenic ions are implanted into the polysilicon film 36. At this time, the arsenic concentration curve d is present in the polysilicon film 36 as shown in FIG. 4C.

Figure 4D:
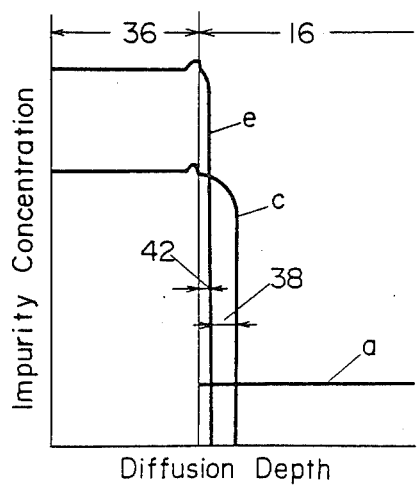

Next, after forming the Si$_3$N$_4$ film 40 as shown in FIG. 1F, heat treatment is applied, and the N+ diffusion layer 42 of a shallow depth of diffusion is formed as emitter diffusion layer as shown in FIG. 4D. At this time, too, since the arsenic diffusion speed in the polysilicon film 36 is fast, like boron, the arsenic concentration in the polysilicon film 36 is stabilized in a short time of heat treatment, and this polysilicon film 36 becomes the diffusion source to promote diffusion of arsenic in the N-epitaxial layer 16, which results in the arsenic concentration curve e showing a sharp tail.

In this way, therefore, since the diffusion layer is formed by heat treatment by implanting ions into the polysilicon film, the emitter diffusion layer 42 and active base diffusion layer 38 of an extremely shallow depth of diffusion may be formed.

The first embodiment shown in FIG. 1 was used in the explanation above, but in the second and third embodiments shown in FIG. 2 and FIG. 3, the emitter diffusion layer and active base diffusion layer of a shallow depth of diffusion may be formed in a similar method.

Incidentally, the NPN bipolar transistor was referred to in the explanation of the first, second and third embodiments herein, but a PNP type bipolar transistor may be obtained in a similar method.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A fabrication method of a semiconductor device comprising:

a step of forming a thin film pattern on a semiconductor substrate on which an antioxidation film is formed;

a step of etching said antioxidation film by using said thin film pattern as mask;

a step of forming a first semiconductor film pattern in the other region than said thin film pattern region;

a step of etching a desired region of said thin film pattern;

a step of forming an oxide film on the surface of said first semiconductor film pattern;

a step of etching said antioxidation film; and a step of forming a second semiconductor film pattern in a desired region.

2. The fabrication method of a semiconductor device according to claim 1, wherein the antioxidation film is an Si$_3$N$_4$ film.

3. The fabrication method of a semiconductor device according to claim 1, wherein the thin film pattern is an SiO$_2$ film pattern.

4. The fabrication method of a semiconductor device according to claim 1, wherein the first semiconductor film pattern is a polysilicon film pattern.

5. The fabrication method of a semiconductor device according to claim 1, wherein the second semiconductor film pattern is a polysilicon film pattern.

6. A fabrication method of a semiconductor device comprising:
- a step of forming a thin film pattern on a semiconductor substrate on which an antioxidation film is formed;
- a step of etching said antioxidation film using said thin film pattern as mask;
- a step of forming a first semiconductor film on the entire surface;
- a step of implanting ions of a first impurity into said first semiconductor film in a desired region;
- a step of etching said first semiconductor film on said thin film pattern;
- a step of etching a desired region of said thin film pattern;
- a step of forming a first diffusion layer by diffusing the first impurity in said first semiconductor film into said semiconductor substrate simultaneously when forming an oxide film on said first semiconductor film by elective oxidation;
- a step of etching said antioxidation film;
- a step of forming a second semiconductor film on the entire surface;
- a step of forming a second diffusion layer in said semiconductor substrate by heat treatment after implanting ions of a second impurity into second semiconductor film in a desired region;
- a step of forming a third diffusion layer in said semiconductor substrate by heat treatment after implanting ions of a third impurity into second semiconductor film; and
- a step of forming said second semiconductor film pattern in a desired region.

7. The fabrication method of a semiconductor device according to calim 6, wherein the antioxidation film is an $Si_3N_4$ film.

8. The fabrication method of a semiconductor device according to claim 6, wherein the thin film pattern is an $SiO_2$ film pattern.

9. The fabrication method of a semiconductor device according to claim 6, wherein the first semiconductor film is a polysilicon film.

10. The fabrication method of a semiconductor device according to claim 6, wherein the second semiconductor film is a polysilicon film.

11. The fabrication method of a semiconductor device according to claim 6, wherein the first and second diffusion layers are P-type diffusion layers, and the third diffusion layer is an N-type diffusion layer.

12. A fabrication method of a semiconductor device comprising:
- a step of forming a first thin film selectively on a semiconductor substrate on which an antioxidation film is formed;
- a step of forming a second thin film on the entire surface;
- a step of etching said second thin film by anisotropic dry etching to leave the second thin film at the side wall of said first thin film;
- a step of etching said antioxidation film using said first and second thin films as mask;
- a step of selectively removing said second thin film;
- a step of forming a first oxide film by elective oxidation using said antioxidation film as mask;
- a step of etching said antioxidation film using said first thin film as mask;
- a step of forming a first semiconductor film pattern in other region than said first thin film region;
- a step of etching a desired region of said first thin film;
- a step of forming a second oxide film on the surface of said first semiconductor film pattern;
- a step of etching said antioxidation film; and
- a step of forming a second semiconductor film pattern in a desired region.

13. The fabrication method of a semiconductor device according to claim 12, wherein the antioxidation film is an $Si_3N_4$ film.

14. The fabrication method of a semiconductor device according to claim 12, wherein the first thin film is an $SiO_2$ film.

15. The fabrication method of a semiconductor device according to claim 12, wherein the second thin film is a polysilicon film.

16. The fabrication method of a semiconductor device according to claim 12, wherein the second thin film is a PSG film.

17. The fabrication method of a semiconductor device according to claim 12, wherein the first semiconductor film pattern is a polysilicon film pattern.

18. The fabrication method of a semiconductor device according to claim 12, wherein the second semiconductor film pattern is a polysilicon film pattern.

19. The fabrication method of a semiconductor device comprising:
- a step of forming a first thin film selectively on a semiconductor substrate on which an antioxidation film is formed;
- a step of forming a second thin film on the entire surface;
- a step of etching said second thin film by anisotropic dry etching to leave the second thin film on the side wall of said first thin film;
- a step of etching said antioxidation film by using said first and second thin films as mask;
- a step of selectively removing said second thin film;
- a step of forming a first oxide film by elective oxidation by using said antioxidation film as mask;
- a step of etching said antioxidation film by using said first thin film as mask;
- a step of forming a first semiconductor film on the entire surface;
- a step of implanting ions of a first impurity into said first semiconductor film in a desired region;
- a step of etching said first semiconductor film on said first thin film;
- a step of etching a desired region of said first thin film;
- a step of forming a first diffusion layer by diffusing said first impurity in said first semiconductor film into said semiconductor substrate simultaneously when forming a second oxide film on said first semiconductor film by elective oxidation;
- a step of etching said antioxidation film;
- a step of forming a second semiconductor film on the entire surface;
- a step of forming a second diffusion layer in said semiconductor substrate by heat treatment after implanting ions of a second impurity into said second semiconductor film in a desired region;

a step of forming a third diffusion layer in said semiconductor substrate by heat treatment after implanting ions of a third impurity into said second semiconductor film; and a step of forming said second semiconductor film pattern in a desired region.

20. The fabrication method of a semiconductor device according to claim 19, wherein the antioxidation film is an $Si_3N_4$ film.

21. The fabrication method of a semiconductor device according to claim 19, wherein the first thin film is an $SiO_2$ film.

22. The fabrication method of a semiconductor device according to claim 19, wherein the second thin film is a polysilicon film.

23. The fabrication method of a semiconductor device according to claim 19, wherein the second thin film is a PSG film.

24. The fabrication method of a semiconductor device according to claim 19, wherein the first semiconductor film pattern is a polysilicon film pattern.

25. The fabrication method of a semiconductor device according to claim 19, wherein the second semiconductor film pattern is a polysilicon film pattern.

26. The fabrication method of a semiconductor device according to claim 19, wherein the first and second diffusion layers are P-type diffusion layers, and the third diffusion layer is an N-type diffusion layer.

27. The fabrication method of a semiconductor device comprising:

a step of forming a second semiconductor film of a semiconductor substrate on which a first semiconductor film having first impurity, a first diffusion layer and a separation oxide film separating an emitter and a base;

a step of implanting ions of second impurity in said second semiconductor film at desired position and then, of forming a second diffusion layer in said semiconductor substrate by heat treatment; and a step of implanting ions of third impurity in said second semiconductor film and then, of forming a third diffusion layer in said semiconductor substrate by heat treatment.

28. The fabrication method of a semiconductor device according to claim 27, wherein said second semiconductor film is a polysilicon film.

29. The fabrication method of a semiconductor device according to claim 27, wherein said second impurity is boron.

30. The fabrication method of a semiconductor device according to claim 27, wherein said third impurity is arsenic.

* * * * *